(12) United States Patent
Tarazi et al.

(10) Patent No.: US 8,970,017 B1
(45) Date of Patent: Mar. 3, 2015

(54) HIGH FREQUENCY MONOLITHIC MICROWAVE INTEGRATED CIRCUIT CONNECTION

(71) Applicant: M/A-COM Technology Solutions Holdings, Inc., Lowell, MA (US)

(72) Inventors: Jabra Tarazi, Oakhurst (AU); Leif Göran Martin Snygg, Partille (SE)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 0 days.

(21) Appl. No.: 14/016,431

(22) Filed: Sep. 3, 2013

(51) Int. Cl.
*H01L 23/58* (2006.01)
*H01L 23/00* (2006.01)

(52) U.S. Cl.
CPC ................ *H01L 24/05* (2013.01); *H01L 24/03* (2013.01)
USPC ...................... 257/664; 257/459; 257/E23.02

(58) Field of Classification Search
CPC ......... H01L 23/58; H01L 23/48; H01L 23/52; H01L 23/50; H03F 3/60; H01P 5/028; H01P 5/02

USPC ................ 257/259, 459, 664, 676, 662, 232, 257/E23.02; 333/185, 235
See application file for complete search history.

(56) References Cited

U.S. PATENT DOCUMENTS

| | | | |
|---|---|---|---|
| 6,737,931 B2 * | 5/2004 | Amparan et al. | 333/34 |
| 6,762,493 B2 * | 7/2004 | Kojima et al. | 257/727 |
| 7,548,143 B2 * | 6/2009 | Kim et al. | 333/260 |

* cited by examiner

*Primary Examiner* — Cuong Q Nguyen
*Assistant Examiner* — Yosef Gebreyesus
(74) *Attorney, Agent, or Firm* — Christopher P. Maiorana, PC (57) ABSTRACT

An apparatus having a bonding pad and a conductor is disclosed. The bonding pad may be formed in a conductive layer of an integrated circuit. The bonding pad generally has (i) a bond region, (ii) an interface edge sized to match a transmission line and (iii) a tapered region between the bond region and the interface edge. The interface edge may be narrower than the bond region. The tapered region generally has a non-rectangular shape that spans from the bond region to the interface edge. The conductor may be bonded to the bond region. The conductor is generally configured to exchange a signal with the bond region. The signal may be in a microwave frequency range.

19 Claims, 9 Drawing Sheets

HIGH FREQUENCY MONOLITHIC MICROWAVE INTEGRATED CIRCUIT CONNECTION

FIELD OF THE INVENTION

The present invention relates to high frequency input/output die connections generally and, more particularly, to a method and/or apparatus for implementing a high frequency monolithic microwave integrated circuit connection.

BACKGROUND OF THE INVENTION

Conventional radio frequency (i.e., RF) bonding pads are rectangular and have reasonable performance. Making the radio frequency bonding pads smaller improves the performance at frequencies above 8 gigahertz. However, sharp angles in the traces degrade the performance as the frequency increases and so external compensation becomes more difficult. Furthermore, mechanical yields are lower in manual and automated assembly factory environments with the smaller pads which lead to lower electrical yields.

It would be desirable to implement a high frequency monolithic microwave integrated circuit connection.

SUMMARY OF THE INVENTION

The present invention concerns an apparatus having a bonding pad and a conductor. The bonding pad may be formed in a conductive layer of an integrated circuit. The bonding pad generally has (i) a bond region, (ii) an interface edge sized to match a transmission line and (iii) a tapered region between the bond region and the interface edge. The interface edge may be narrower than the bond region. The tapered region generally has a non-rectangular shape that spans from the bond region to the interface edge. The conductor may be bonded to the bond region. The conductor is generally configured to exchange a signal with the bond region. The signal may be in a microwave frequency range.

The objects, features and advantages of the present invention include providing a high frequency monolithic microwave integrated circuit connection that may (i) reduce a radio frequency pad size compared with conventional designs, (ii) have sufficient surface area on the radio frequency pad to facilitate automated bonding techniques, (iii) include a chamfered region, (iv) implement an irregular hexagonal shape, (v) support E band frequencies, (vi) provide on-chip compensation for radio frequency signals and/or (vii) be, implemented on an integrated circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments of the present invention generally provide a bonding pad design that supports signals in a radio frequency range (e.g., less than approximately 300 gigahertz-GHz), microwave frequency range (e.g., super-high frequency to extremely high frequency bands of approximately 3 GHz to approximately 300 GHz), a V band (e.g., approximately 50 GHz to approximately 75 GHz), an E band (e.g., approximately 60 GHz to approximately 90 GHz) and/or in a range of approximately 10 GHz to 300 GHz. In some embodiments, the bonding pads generally have an irregular hexagonal (or 6-sided) shape that is tapered to match a corresponding transmission line. The 6 sides may be see as viewed in a plane parallel to a top surface of the circuit 102. The bonding pads include a bond region having sufficient area to reliably accept bonding wires and/or a bonding tape in an automated or manual bonding process. The tapered shape may provide on-chip frequency compensation to account for the inductance of the bonding wires/bonding tape. The invention generally provides a good compromise between the radio frequency performance and mechanical criteria to given an optimal overall monolithic microwave integrated circuit performance in mass production.

Figure 1:
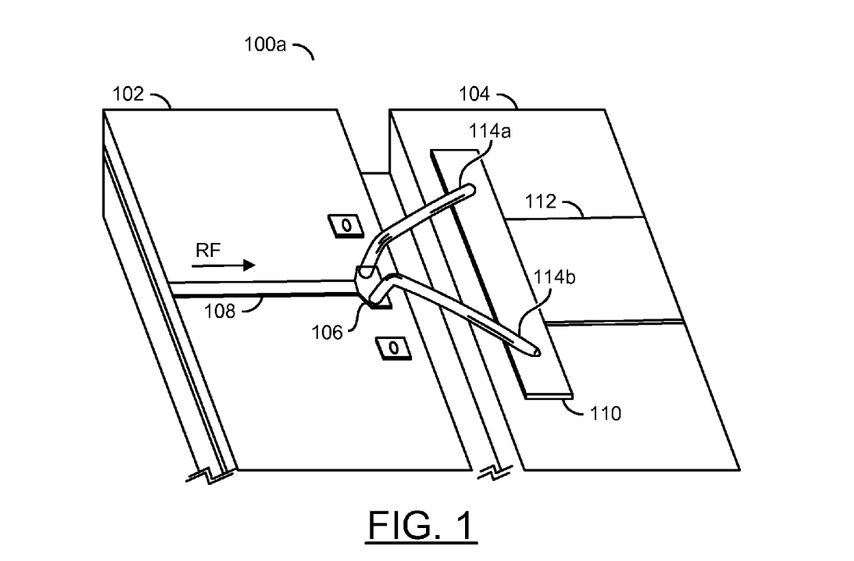
FIG. 1 is a perspective diagram of an apparatus in accordance with a preferred embodiment of the present invention.

Referring to FIG. 1, a perspective diagram of an apparatus 100a is shown in accordance with a preferred embodiment of the present invention. The apparatus (or device or integrated circuit) 100a generally implements a monolithic microwave integrated circuit. The circuit 100a may comprise a block (or circuit) 102, a block (or circuit) 104, a block (or circuit) 106, a block (or circuit) 108, a block (or circuit) 110, a block (or circuit) 112, and one or more blocks (or circuits) 114a-114b. The circuits 102 to 114b may be implemented in hardware and/or software executing on hardware.

The circuit 102 generally implements an integrated circuit. In some embodiments, the circuit 102 is a monolithic microwave integrated circuit. Other embodiments may include, but are not limited to, high frequency circuits, compound semiconductor circuits and the like. In some embodiments, the circuit 102 may be operational to generate a signal (e.g., RF). In other embodiments, the circuit 102 may be operational to receive the signal RF. The signal RF is generally a radio frequency signal in the microwave range. Other types of signals and other frequency ranges may be implemented to meet the criteria of a particular application.

The circuit 102 may be fabricated in compound semiconductors. In some embodiments, the circuit 102 may be fabricated in III-V compounds, such as Gallium Arsenide (e.g., GaAs) or Indium Phosphide (e.g., InP). In some embodiments, the circuit 102 may be fabricated in a Silicon Germanium (e.g., SiGe) compound. In other embodiments, the circuit 102 may be fabricated in a Gallium Nitride (e.g., GaN) compound. Other materials may be used to create the circuit 102 to meet the criteria of a particular application.

The circuit 104 may implement a carrier in some embodiments, another integrated circuit in other embodiments, and a board (or substrate) in still other embodiments. In some embodiments, the circuit 104 is generally operational to receive the signal RF from the circuit 102. In other embodiments, the circuit 104 may present the signal RF to the circuit 102. Other types of signals and other frequency ranges may be implemented to meet the criteria of a particular application.

The circuit 106 may implement a bonding pad. The circuit 106 is generally operational to transfer the signal RF between the circuit 108 and the circuit 110 via the circuits 114a-114b. The bonding pad 106 may be formed in a conductive layer of the circuit 102 proximate an edge of the circuit 102 facing the circuit 104. The circuit 106 generally has (i) a bond region, (ii) an interface edge sized to match a width of the circuit 108 and (iii) a tapered region between the bond region and the interface edge. The interface edge is typically narrower than a parallel edge of the bond region. The tapered region has a non-rectangular (e.g., tapered) shape that spans from opposite sides of the bond region to the interface edge. The bond region or the bond region in combination with the tapered regions generally has sufficient area to receive the circuits 114a-114b in an automated bonding technique reliably. Other shapes may be implemented to meet the criteria of a particular application. For example, the circuit 106 may have an overall "Y" shape, a triangle shape, a curved (e.g., oval or round) shape, an irregular hexagonal shape, and other non-rectangular shapes.

The circuit 108 may implement a transmission line (or wire trace). The circuit 108 is usually fabricated in the same conductive layer as the circuit 106. In some embodiments, the circuit 108 may be operational to carry the signal RF from a source to the circuit 106. The source of the signal RF may be a high frequency power amplifier. In other embodiments, the circuit 108 may be operational to carry the signal RF from the circuit 106 to a destination (or sink) fabricated on the circuit 102.

The circuit 110 may implement a stub region (or circuit). The circuit 110 may be fabricated in a conductive layer of the circuit 104 proximate an edge of the circuit 104 facing the circuit 102. The circuit 110 is generally operational to exchange the signal RF with the circuit 106 via the circuits 114a-114b. The circuit 110 may also be used to compensate for the inductive bond wires or the bonding tapes. In some embodiments, the circuit 110 may have dimensions of approximately 600 micrometers (e.g., μm) in a direction parallel to the edge of the circuit 104 by 100 μm in a direction perpendicular to the edge. Other dimensions may be implemented to meet the criteria of a particular application.

The circuit 112 may implement a transmission line (or wire trace). The circuit 112 is usually fabricated in the same conductive layer as the circuit 110. In some embodiments, the circuit 112 is generally operational to carry the signal RF between a source or a sink and the circuit 110.

Each circuit 114a-114b may implement a bond wire. Each circuit 114a-114b is generally fabricated as a gold wire (or conductor) having a diameter of approximately 15 μm to 25 μm. Other diameters may be implemented to meet the criteria of a particular application. During fabrication, an open end of each circuit 114a-114b may be ball bonded to the circuit 106. Other ends of the circuits 114a-114b may be wedge bonded to the circuit 110. The circuits 114a-114b may be bonded proximate each other at the circuit 106. The circuits 114a-114b are generally bonded apart from each other at opposing ends of the circuit 110 as illustrated.

Figure 2:
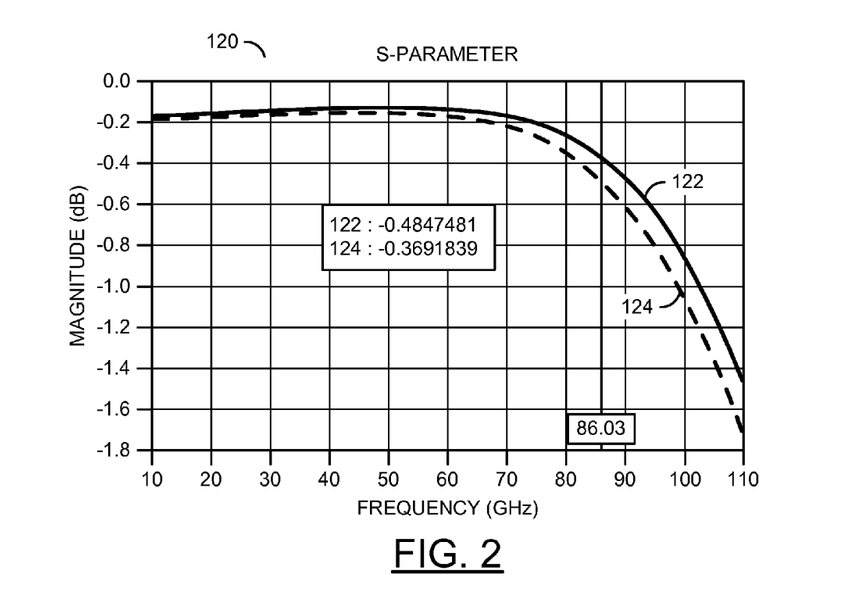
FIG. 2 is a graph illustrating transition performances.

Referring to FIG. 2, a graph 120 illustrating simulated transition performances is shown. The graph 120 generally covers a range of 10 gigahertz (e.g., GHz) to approximately 110 GHz. A curve 122 may illustrate a transition performance of the circuit 100a in terms of a scattering parameter (e.g., a forward complex transmission coefficient S(2,1)). A curve 124 may illustrate a transition performance of a common bonding pad in terms of the scattering parameter. At a frequency of 86 GHz, the circuit 100a may have a lower forward complex transmission coefficient than the common bonding pad by approximately 0.12 decibels (e.g., dB).

Figure 3:
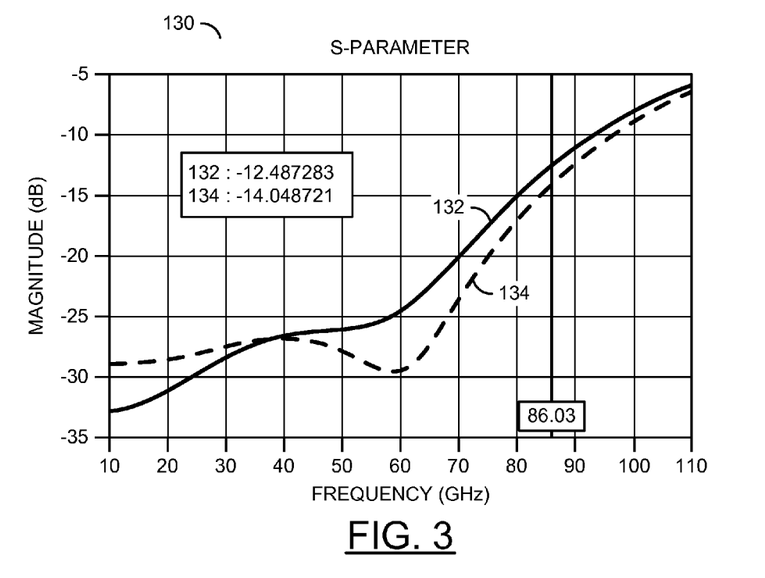
FIG. 3 is a graph illustrating return losses.

Referring to FIG. 3, a graph 130 illustrating simulated return losses is shown. A curve 132 generally shows the return loss of the common bonding pad in terms of a scattering parameter (e.g., an input complex reflection coefficient S(1,1)). A curve 134 generally shows the return loss of the circuit 100a in terms of the scattering parameter. At 86 GHz frequency, the circuit 100a may have a better input complex reflection coefficient than the common bonding pad by approximately 1.5 dB.

Figure 4:
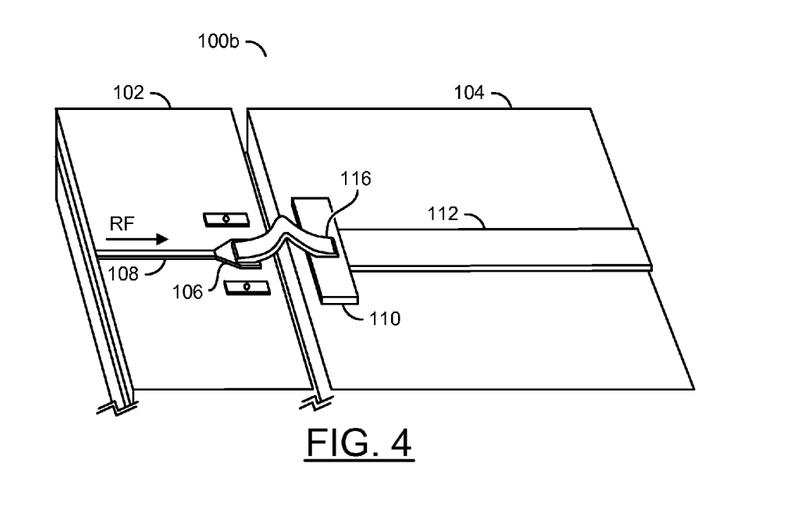
FIG. 4 is a perspective diagram of another apparatus.

Referring to FIG. 4, a perspective diagram of an apparatus 100b is shown. The apparatus (or device or integrated circuit) 100b generally implements a monolithic microwave integrated circuit. The circuit 100b may be a variation of the circuit 100a. The circuit 100b generally comprises the circuit 102, the circuit 104, the circuit 106, the circuit 108, the circuit 110, the circuit 112, and a block (or circuit) 116. The circuit 116 may be implemented in hardware and/or software executing on hardware.

The circuit 116 may implement a bond ribbon. The circuit 116 is generally fabricated as a gold ribbon (or conductor) having a width of approximately 50 μm to 150 μm and a length of approximately 200 μm to 500 μm. Other widths and/or lengths may be implemented to meet the criteria of a particular application. During fabrication, an end of the circuit 116 may be wedge bonded to the circuit 106. The other end of the circuit 116 may be wedge bonded to the circuit 110. The bond region or the bond region in combination with the tapered regions generally has sufficient area to reliably receive the circuit 116 in an automated bonding technique.

Figure 5:
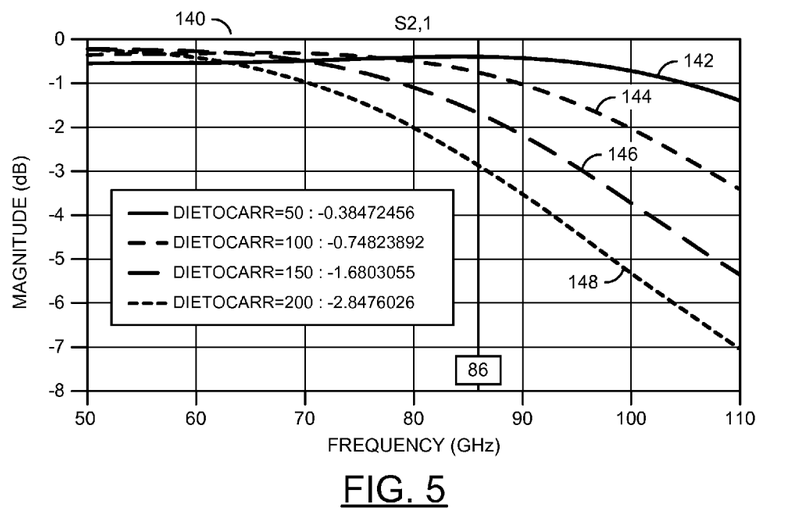
FIG. 5 is a graph illustrating transition performances as a function of a die to carrier separation.

Referring to FIG. 5, a graph 140 illustrating simulated transition performances as a function of a die to carrier separation is shown. A parameter (e.g., DIETOCARR) generally defines a distance between facing physical edges the circuit 102 and the circuit 104. A length of the circuit 116 may be approximately 200 μm. Curves 142, 144, 146 and 148 generally show the forward complex transmission coefficient S(2,1) performance at separations of 50 μm, 100 μm, 150 μm and 200 μm, respectively.

Figure 6:
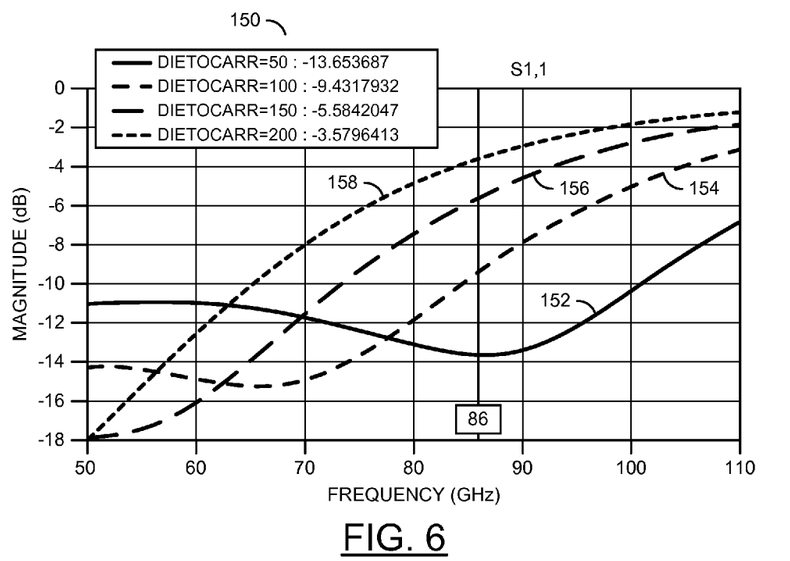
FIG. 6 is a graph illustrating return losses as a function of the die to carrier separation.

Referring to FIG. 6, a graph 150 illustrating simulated return losses as a function of the die to carrier separation is shown. A length of the circuit 116 may be approximately 200 μm. Curves 152, 154, 156 and 158 generally show the input complex reflection coefficient S(1,1) performances at separations of 50 μm, 100 μm, 150 μm and 200 μm, respectively.

Figure 7:
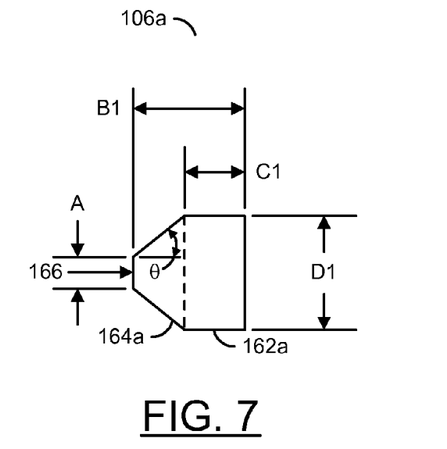
FIG. 7 is a diagram of a bonding pad.

Referring to FIG. 7, a diagram of an example implementation of a circuit 106a is shown. The circuit 106a may be representative of the circuit 106. The circuit 106a generally comprises a region (or area) 162a, a region (or area) 164a and an edge (or interface) 166. The edge 166 may have a dimension (e.g., A) of approximately 35 μm. An overall width (e.g., B1) of the circuit 106a may be approximately 90 μm. An overall height (e.g., D1) of the circuit 106a may be approximately 120 μm.

The region 162a may implement a bond region. The region 162a is generally sized to bond with the circuits 114a-114b or the circuit 116. The region 162a may have dimensions (e.g., C1 by D1) of approximately 47.5 μm by 120 μm. Other dimensions may be implemented to meet the criteria of a particular application.

The region 164a may implement a tapered region. The region 164a is generally sized and shaped to transition from the region 162a to the edge 166 of the circuit 106a. The region 164a generally has a trapezoid (or chamfered or bezeled) shape.

The edge 166 is generally sized to match the width of the circuit 108. When fabricated, the circuit 108 connects to the circuit 106a at the edge 166.

An angle (e.g., θ) may be formed between an edge of the circuit 108 and an output edge of the region 164a. The angle may range from approximately 30 degrees to approximately 45 degrees. Other angles may be implemented to meet the criteria of a particular application.

Figure 8:
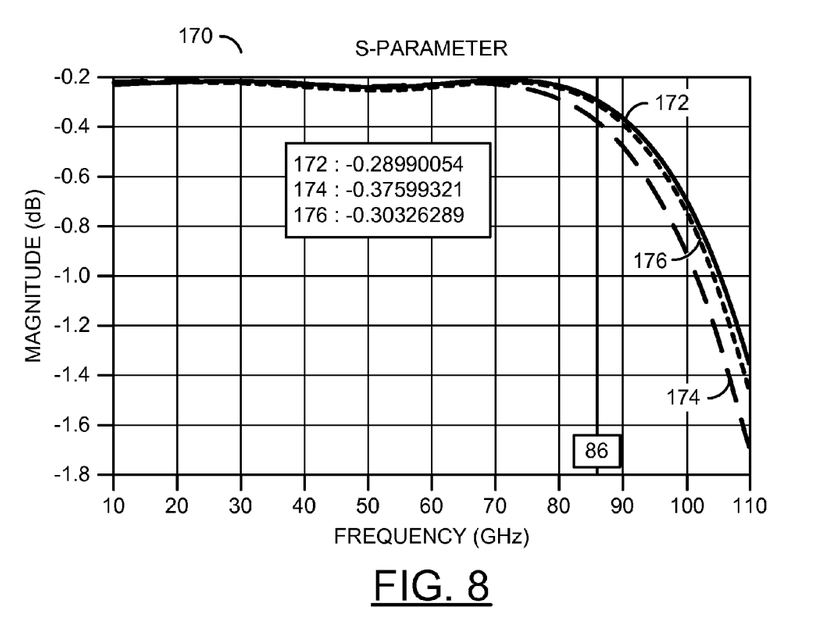
FIG. 8 is a graph illustrating transition performances using the bonding pad of FIG. 7.

Referring to FIG. 8, a graph 170 illustrating simulated transition performances using the circuit 106a is shown. A curve 172 may illustrate a transition performance of the circuit 100a implementing a common bonding pad. A curve 174 generally illustrates the performance of the circuit 100a implementing the circuit 106a in terms of the forward complex transmission coefficient S(2,1). A curve 176 may illustrate a transition performance of the circuit 100a implementing the circuit 106a with extra space in terms of the forward complex transmission coefficient S(2,1). The extra space generally refers to an extra separation between the two wire bonds 114a-114b at an interface to the circuit 106a.

Figure 9:
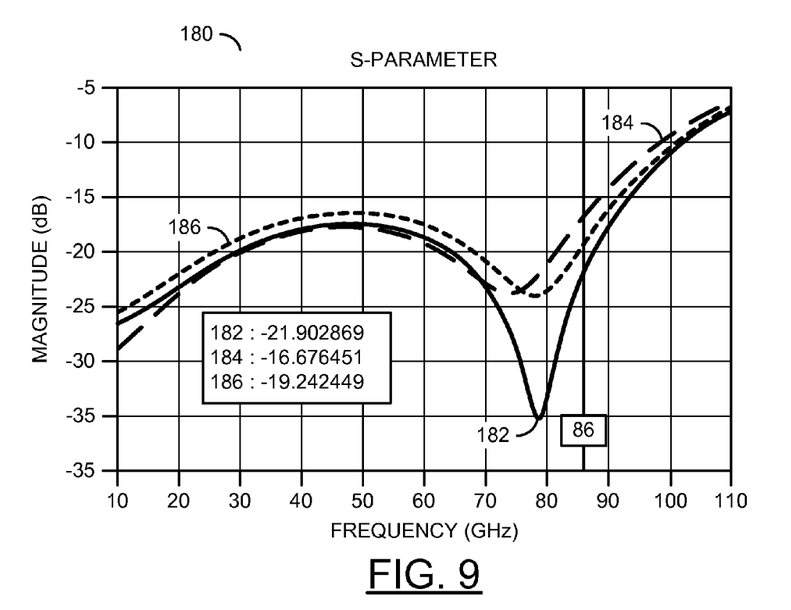
FIG. 9 is a graph illustrating return losses using the bonding pad of FIG. 7.

Referring to FIG. 9, a graph 180 illustrating simulated return losses using the circuit 106a is shown. A curve 182 generally shows the return loss of the circuit 100a implementing the common bonding pad in terms of the input complex reflection coefficient S(1,1). A curve 184 generally shows the return loss of the circuit 100a implementing the circuit 106a in terms of the input complex reflection coefficient S(1,1). A curve 186 may illustrate the return loss of the circuit 100a implementing the circuit 106a with extra space in terms of the input complex reflection coefficient S(1,1).

Figure 10:
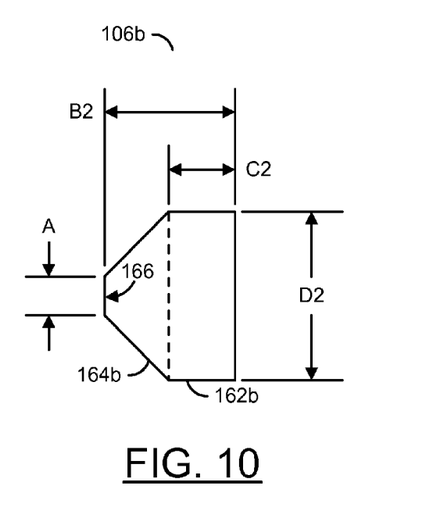
FIG. 10 is a diagram of a bonding pad.

Referring to FIG. 10, a diagram of an example implementation of a circuit 106b is shown. The circuit 106b may be representative of the circuit 106. The circuit 106b generally comprises a region (or area) 162b, a region (or area) 164b and the edge 166. An overall width (e.g., B2) of the circuit 106b may be approximately 120 μm. An overall height (e.g., D2) of the circuit 106b may be approximately 155 μm.

The region 162b may implement the bond region. The region 162b is generally sized to bond with the circuits 114a-114b or the circuit 116. The region 162b may have dimensions (e.g., C2 by D2) of approximately 60 μm by 155 μm. Other dimensions may be implemented to meet the criteria of a particular application.

The region 164b may implement the tapered region. The region 164b is generally sized and shaped to transition from the region 162b to the edge 166 of the circuit 106a. The region 164b generally has a trapezoid (or chamfered or bezeled) shape.

Figure 11:
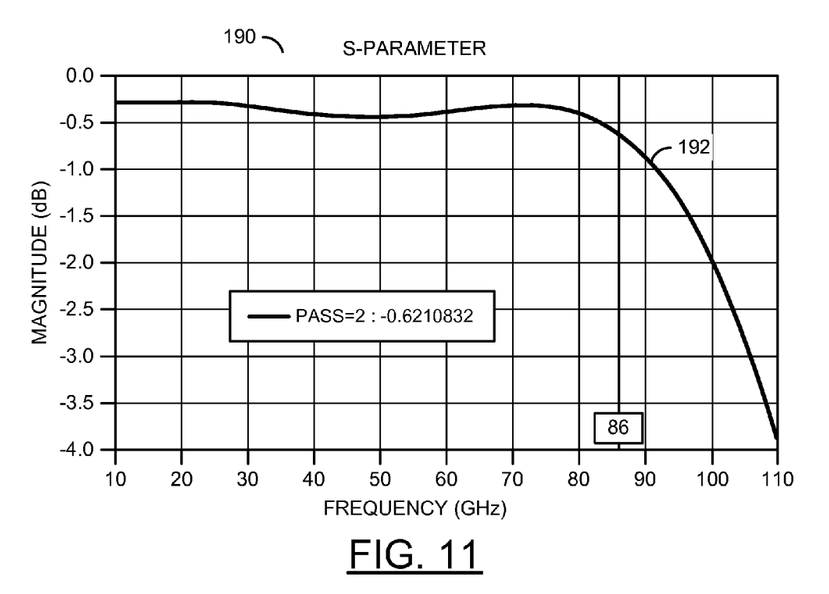
FIG. 11 is a graph illustrating a transition performance using the bonding pad of FIG. 10.

Referring to FIG. 11, a graph 190 illustrating a simulated transition performance using the circuit 106b is shown. A curve 192 may illustrate a transition performance of the circuit 100a implementing the circuit 106b in terms of the forward complex transmission coefficient S(2,1).

Figure 12:
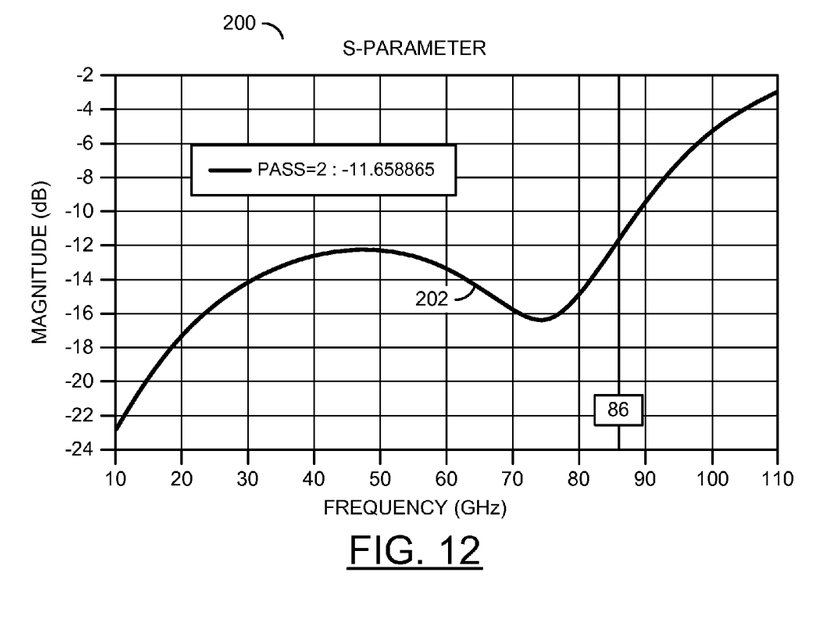
FIG. 12 is a graph illustrating a return losses using the bonding pad of FIG. 10.

Referring to FIG. 12, a graph 200 illustrating simulated return losses using the circuit 106b is shown. A curve 202 generally shows the return loss of the circuit 100a implementing the circuit 106b in terms of the input complex reflection coefficient S(1,1).

Figure 13:
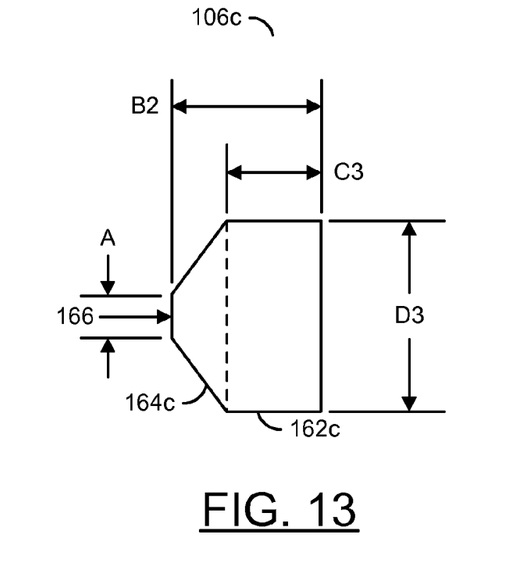
FIG. 13 is a diagram of a bonding pad.

Referring to FIG. 13, a diagram of an example implementation of a circuit 106c is shown. The circuit 106c may be representative of the circuit 106. The circuit 106c generally comprises a region (or area) 162c, a region (or area) 164c and the edge 166. An overall width (e.g., B2) of the circuit 106c may be approximately 120 μm. An overall height (e.g., D3) of the circuit 106c may be approximately 150 μm.

The region 162c may implement the bond region. The region 162c is generally sized to bond with the circuits 114a-114b or the circuit 116. The region 162c may have dimensions (e.g., C3 by D3) of approximately 80 μm by 150 μm. Other dimensions may be implemented to meet the criteria of a particular application.

The region 164c may implement the tapered region. The region 164c is generally sized and shaped to transition from the region 162c to the edge 166 of the circuit 106c. The region 164c generally has a trapezoid (or chamfered or bezeled) shape.

Figure 14:
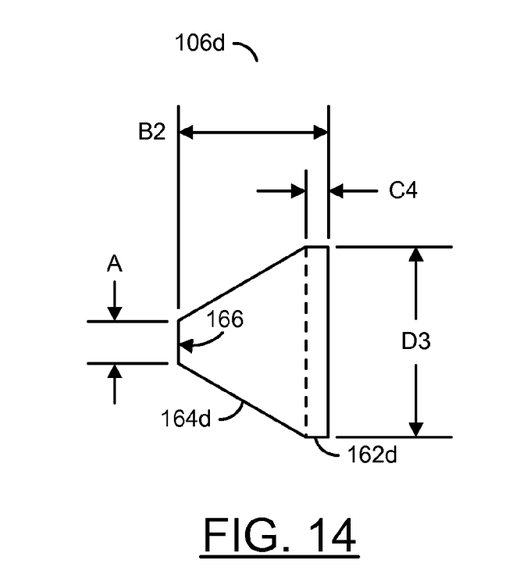
FIG. 14 is a diagram of another bonding pad.

Referring to FIG. 14, a diagram of an example implementation of a circuit 106d is shown. The circuit 106d may be representative of the circuit 106. The circuit 106d generally comprises a region (or area) 162d, a region (or area) 164d and the edge 166. An overall width (e.g., B2) of the circuit 106c may be approximately 120 μm. An overall height (e.g., D3) of the circuit 106d may be approximately 150 μm.

The region 162d may implement the bond region. The region 162d is generally sized to bond with the circuits 114a-114b or the circuit 116. The region 162d may have dimensions (e.g., C4 by D3) of approximately 20 μm by 150 μm. Other dimensions may be implemented to meet the criteria of a particular application.

The region 164d may implement the tapered region. The region 164d is generally sized and shaped to transition from the region 162d to the edge 166 of the circuit 106d. The region 164d generally has a trapezoid (or chamfered or bezeled) shape.

Figure 15:
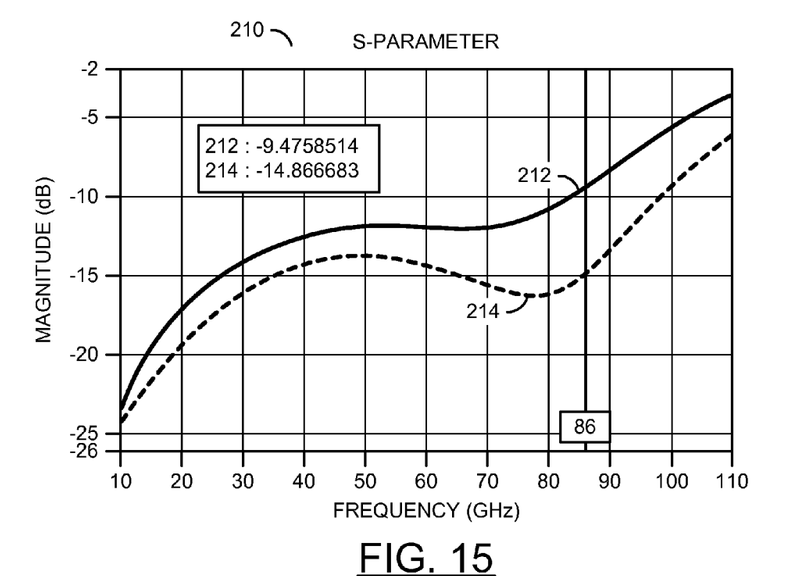
FIG. 15 is a graph illustrating return losses using the bonding pads of FIGS. 13 and 14.

Referring to FIG. 15, a graph 210 illustrating simulated return losses of the circuits 106c and 106d is shown. A curve 212 may illustrate a return loss performance of the circuit 100a implementing the circuit 106c in terms of the input complex reflection coefficient S(1,1). A curve 214 may illustrate a return loss performance of the circuit 100a implementing the circuit 106d in terms of the input complex reflection coefficient S(1,1).

Figure 16:
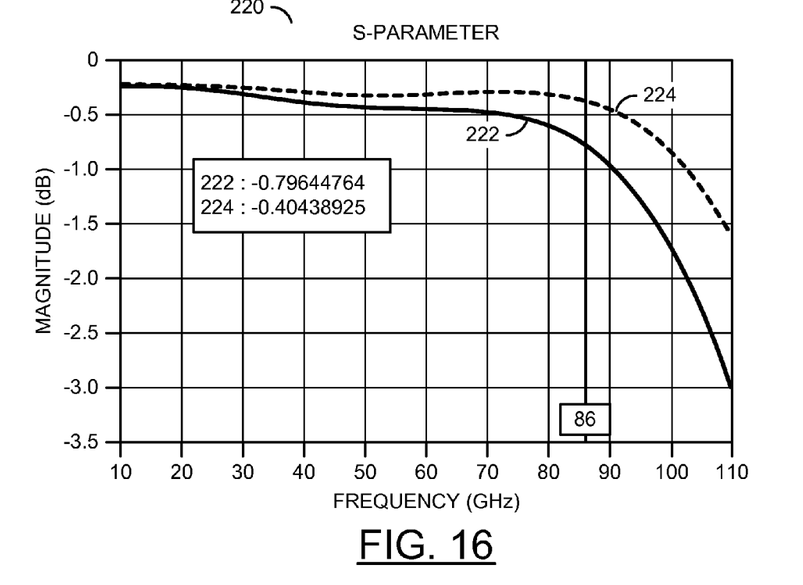
FIG. 16 is a graph illustrating insertion losses using the bonding pads of FIGS. 13 and 14.
Figure 17A:
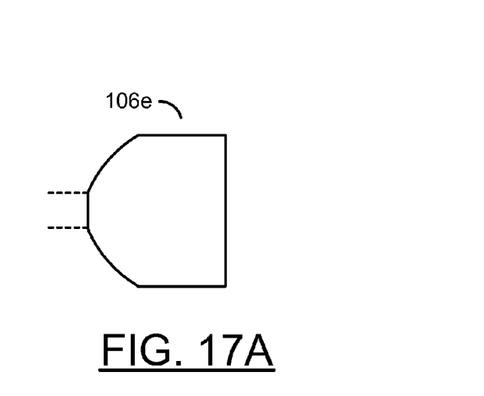
FIGS. 17A-17F are diagrams of additional shapes of bonding pads.
Figure 17B:
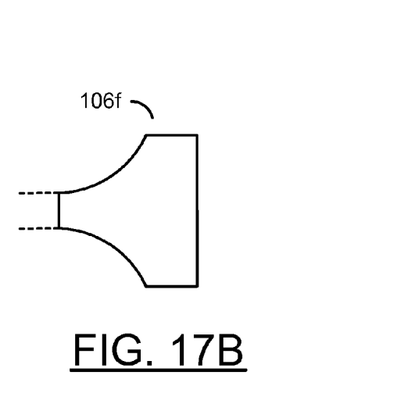
Figure 17C:
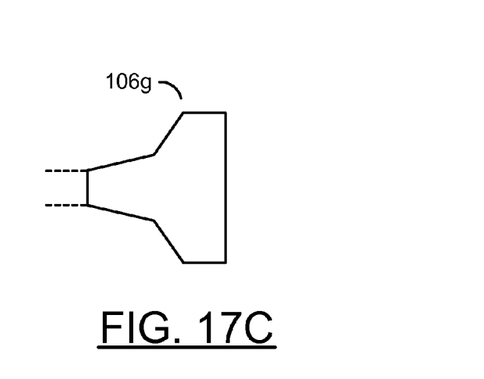
Figure 17D:
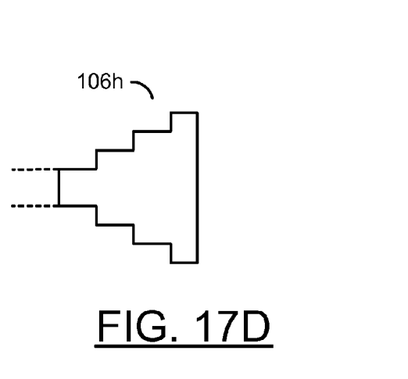
Figure 17E:
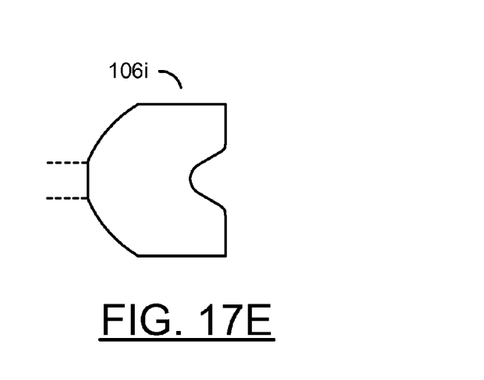
Figure 17F:
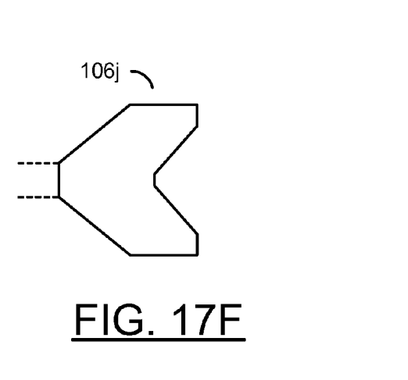

Referring to FIG. 16, a graph 220 illustrating simulated insertion losses of the circuits 106c and 106d is shown. A curve 222 may illustrate an insertion loss performance of the circuit 100a implementing the circuit 106c in terms of the forward complex transmission coefficient S(2,1). A curve 224 may illustrate an insertion loss performance of the circuit 100a implementing the circuit 106d in terms of the forward complex transmission coefficient S(2,1).

Referring to FIGS. 17A-17F, diagrams of additional shapes of bonding pads 106e-106j are shown. Bonding pads 106e and 106i may include a convex shape (e.g., oval or round) in the tapered regions. Bonding pad 106f generally has concave shape (e.g., oval or round) in the tapered region. Bonding pad 106f may include multiple segments, each sloped at a different angle in the tapered region. Bonding pad 106h generally implements a stair-stepped tapered region. Bonding pads 106i and 106j include a notch in the bond region. The bonding pad 106j has the overall "Y" shape.

The functions and structures illustrated in the diagrams of FIGS. 1-17F may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors.

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a bonding pad formed in a conductive layer of an integrated circuit, said bonding pad having (i) a bond region, (ii) an interface edge sized to match a transmission line and (iii) a tapered region between said bond region and said interface edge, wherein (a) said interface edge is narrower than said bond region and (b) said tapered region has a non-rectangular shape that spans from said bond region to said interface edge; and
    a conductor bonded to said bond region, wherein (i) said conductor is configured to exchange a signal with said bond region and (ii) said signal is in a microwave frequency range.

2. The apparatus according to claim 1, wherein said signal is in a frequency range of approximately 10 gigahertz to approximately 300 gigahertz.

3. The apparatus according to claim 1, further comprising a transmission line formed in said conductive layer and connected to said interface edge.

4. The apparatus according to claim 1, further comprising a stub region on a device separate from said integrated circuit.

5. The apparatus according to claim 4, wherein said conductor comprises a plurality of bond wires that connect said bond region to said stub region.

6. The apparatus according to claim 4, wherein said conductor comprises a single bond ribbon that connects said bond region to said stub region.

7. The apparatus according to claim 1, wherein (i) an outer edge of said tapered region forms an angle relative to a perpendicular to said interface edge and (ii) said angle ranges from approximately 30 degrees to approximately 45 degrees.

8. The apparatus according to claim 1, wherein said bonding pad has six sides in a plane parallel to a top surface of said integrated circuit.

9. The apparatus according to claim 1, wherein said bonding pad has at least one of (i) a concave curved shape in said tapered region, (ii) a convex curved shape in said tapered region, (iii) multiple sloped lines in said tapered region, (iv) a notch in said bond region, (v) a Y shape and (vi) a triangular shape.

10. A method for creating a monolithic microwave integrated circuit connection, comprising the steps of:
    (A) forming a bonding pad in a conductive layer of said integrated circuit, said bonding pad having (i) a bond region, (ii) an interface edge sized to match a transmission line and (iii) a tapered region between said bond region and said interface edge, wherein (a) said interface edge is narrower than said bond region and (b) said tapered region has a non-rectangular shape that spans from said bond region to said interface edge; and
    (B) bonding a conductor to said bond region, wherein (i) said conductor is configured to exchange a signal with said bond region and (ii) said signal is in a microwave frequency range.

11. The method according to claim 10, wherein said signal is in a frequency range of approximately 10 gigahertz to approximately 300 gigahertz.

12. The method according to claim 10, further comprising the step of:
    forming a transmission line in said conductive layer, said transmission line connecting to said interface edge.

13. The method according to claim 10, further comprising the step of:
    forming a stub region on a device separate from said integrated circuit.

14. The method according to claim 13, wherein said conductor comprises a plurality of bond wires that connect said bond region to said stub region.

15. The method according to claim 13, wherein said conductor comprises a single bond ribbon that connects said bond region to said stub region.

16. The method according to claim 10, wherein (i) an outer edge of said tapered region forms an angle relative to a perpendicular to said interface edge and (ii) said angle ranges from approximately 30 degrees to approximately 45 degrees.

17. The method according to claim 10, wherein said bonding pad has six sides in a plane parallel to a top surface of said integrated circuit.

18. The method according to claim 10, wherein said bonding pad has at least one of (i) a concave curved shape in said tapered region, (ii) a convex curved shape in said tapered region, (iii) multiple sloped lines in said tapered region, (iv) a notch in said bond region, (v) a Y shape and (vi) a triangular shape.

19. An apparatus comprising:
    means for bonding formed in a conductive layer of an integrated circuit, said means for bonding having (i) a bond region, (ii) an interface edge sized to match a transmission line and (iii) a tapered region between said bond region and said interface edge, wherein (a) said interface edge is narrower than said bond region and (b) said tapered region has a non-rectangular shape that spans from said bond region to said interface edge; and
    means for conducting connected to said bond region, wherein (i) said means for conducting is configured to exchange a signal with said bond region and (ii) said signal is in a microwave frequency range.

* * * * *